(12) United States Patent
Khor et al.

(10) Patent No.: US 8,071,470 B2
(45) Date of Patent: Dec. 6, 2011

(54) WAFER LEVEL PACKAGE USING STUD BUMP COATED WITH SOLDER

(75) Inventors: Lily Khor, Perak (MY); Yong Lam Wai, Perak (MY); Lau Choong Keong, Perak (MY)

(73) Assignee: Carsem (M) SDN. BHD., Perak Darul Ridzuan (MY)

( * ) Notice: Subject to any disclaimer, the term of this patent is extended or adjusted under 35 U.S.C. 154(b) by 24 days.

(21) Appl. No.: 12/475,362

(22) Filed: May 29, 2009

(65) Prior Publication Data
US 2010/0102444 A1    Apr. 29, 2010

(30) Foreign Application Priority Data
Oct. 23, 2008 (MY) ............................... PI 20084228

(51) Int. Cl.
*H01L 21/56* (2006.01)
*H01L 21/60* (2006.01)

(52) U.S. Cl. ............... 438/614; 438/617; 257/E21.506; 257/E21.509

(58) Field of Classification Search .................. 438/614, 438/617; 257/E23.02, E23.021, E21.506, 257/E21.509, 738, 781
See application file for complete search history.

(56) References Cited

U.S. PATENT DOCUMENTS

| | | | | |
|---|---|---|---|---|
| 5,328,079 | A | * | 7/1994 | Mathew et al. ............ 228/180.5 |
| 5,496,775 | A | * | 3/1996 | Brooks ........................ 438/127 |
| 5,559,054 | A | * | 9/1996 | Adamjee ..................... 438/617 |
| 6,017,812 | A | | 1/2000 | Yonezawa et al. |
| 6,098,868 | A | | 8/2000 | Mae et al. |
| 6,211,461 | B1 | | 4/2001 | Park et al. |
| 6,242,283 | B1 | | 6/2001 | Lo et al. |
| 6,277,669 | B1 | | 8/2001 | Kung et al. |
| 6,387,795 | B1 | | 6/2002 | Shao |
| 6,407,333 | B1 | | 6/2002 | Schroen |
| 6,420,256 | B1 | * | 7/2002 | Ball .............................. 438/613 |
| 6,452,238 | B1 | | 9/2002 | Orcutt et al. |
| 6,885,101 | B2 | | 4/2005 | Storli |
| 6,934,065 | B2 | | 8/2005 | Kinsman |
| 2002/0058403 | A1 | * | 5/2002 | Farnworth ................... 438/613 |
| 2008/0081399 | A1 | | 4/2008 | Takano et al. |
| 2009/0206480 | A1 | * | 8/2009 | Lam ............................. 257/738 |

FOREIGN PATENT DOCUMENTS

| | | |
|---|---|---|
| CN | 1211854 C | 7/2005 |
| CN | 101154602 A | 4/2008 |

OTHER PUBLICATIONS

Garrou "Wafer-Level Packaging Has Arrived", IEEE Components, Packaging and Manufacturing Technology Society, Semiconductor Society, Oct. 1, 2000.

(Continued)

*Primary Examiner* — George Fourson, III
(74) *Attorney, Agent, or Firm* — Kilpatrick Townsend & Stockton LLP

(57) ABSTRACT

A method of fabricated a wafer level package is described. In one embodiment, the method includes fabricating at least one active device on a semiconductor wafer that has not been singulated, with the active device having a plurality of bonding pads exposed at an upper surface of the wafer. Prior to singulating the semiconductor wafer, a plurality of corresponding stud bumps on the plurality of bonding pads with a wire bonding tool are formed. Thereafter, a molding encapsulation layer is applied over the semiconductor wafer leaving an upper portion of each of the plurality of stud bumps exposed.

18 Claims, 7 Drawing Sheets

OTHER PUBLICATIONS

Garrou et al "Fundamentals of Wafer-Level Packaging" Fundamentals of Microsystems Packaging, pp. 398-418, Chapter 10, Copyright 2001, MCGraw-Hill, New York, New York.

Levine et al "Copper Stud Bumping for Flip-Chip Applications" www.semiconductor.net/index.asp?layout=articlePrint&articleID=CA6339170, Jun. 1, 2006, printed Dec. 14, 2007, p. 8.

Topper "The Wafer-Level Packaging Evolution", Oct. 1, 2004, Reed Business Information.

* cited by examiner

Fig. 7A — 70% of bump height

Fig. 7B — 60% of bump height

50% of bump height

WAFER LEVEL PACKAGE USING STUD BUMP COATED WITH SOLDER

This application claims priority to Malaysian Patent Application No. PI 20084228, filed on Oct. 23, 2008, the disclosure of which is hereby incorporated by reference in its entirety for all purposes.

BACKGROUND OF THE INVENTION

The present invention relates to generally to integrated circuit packaging technology. More specifically, embodiments of the invention pertain to the use of wire bonding techniques to form stud bumps for wafer-level packages.

Integrated circuits are typically packaged before being used in electronic systems. Integrated circuit (IC) packages protect the integrated circuits from the surrounding environment and provide electrical connections to other components of the electronic systems. In a conventional packaging arrangement, a wafer containing integrated circuits is first singulated into individual chips and then packaged for testing and delivery. This normally includes transporting the wafer (or singulated chips) from a semiconductor manufacturing facility where front-end processes are performed to a separate packaging facility where back-end process are performed to assemble and package the IC.

In contrast, in a wafer-level packaging approach. IC packaging is formed at the wafer level on the wafer prior to singulation. The packages can be manufactured at chip size and at reduced cost compared to standard IC packages. Typical wafer level packages use solder bumps to form electrical connections between the packaged semiconductor die and external devices. Under bump metallurgy (UMB) is formed underneath the solder bumps to minimize metallurgical reactions with the solder and improve the connection.

While a number of commercially successful wafer-level packaging processes have been developed, improved waver level packages are desirable.

BRIEF SUMMARY OF THE INVENTION

The present invention relates to generally to wafer level packaging technology. More specifically, embodiments of the invention pertain to the use of wire bonding techniques to form stud bumps for wafer-level packages.

In one embodiment of the present invention, a method of fabricating a wafer level package is described. The method includes fabricating at least one active device on a semiconductor wafer that has not been singulated where the active device having a plurality of bonding pads exposed at an upper surface of the wafer. Prior to singulating the semiconductor wafer, a plurality of corresponding stud bumps are formed on the plurality of bonding pads with a wire bonding tool. Thereafter, a molding encapsulation layer is applied over the semiconductor wafer leaving an upper portion of each of the plurality of stud bumps exposed.

In some embodiments, the stud bumps are formed by lowering the capillary of the wire bonding tool towards the semiconductor wafer to allow an extruded portion of the wire from the feed hole to contact and form a first bond with a corresponding bond pad without breaking the wire; raising the capillary away from the semiconductor wafer while allowing the extruded portion of the wire to stay in contact with the bond pad without breaking the wire; offsetting the capillary from the first bond in a direction parallel to the upper surface of the semiconductor wafer; lowering the capillary so that the bottom face of the capillary contacts the stud bump and flattens a top surface of the stud bump; and moving the capillary away from the semiconductor die to separate the wire from the stud bump.

In another embodiment of the present invention, a method of fabricating a plurality of wafer-level packages is described. The method includes fabricating a plurality of active devices on a semiconductor wafer that has not been singulated. Each of the active devices has a plurality of bonding pads exposed at an upper surface of the wafer. Prior to singulating the semiconductor wafer to separate the plurality of active devices, for each of the plurality of active devices the method includes: forming a plurality of stud bumps corresponding to the plurality of bonding pads associated with the active device using a wire bonding tool; applying a molding encapsulation layer over the semiconductor wafer leaving an upper portion of each of the plurality of stud bumps formed on each of the active devices exposed; applying solder paste over each of the exposed of stud bumps; reflowing the solder paste; and cleaning the substrate with flux. In some specific embodiments the plurality of stud bumps are copper stud bumps.

In yet another specific embodiment of the present invention a semiconductor wafer package is provided. The package includes a semiconductor die having an upper surface, a plurality of bonding pads formed on the semiconductor die, and a plurality of stud bumps corresponding to the plurality of bonding pads. Each stud bump is directly coupled to a bonding pad without under bump metallization between the stud bump and the bonding pad. The package additionally includes an encapsulation layer overlying the semiconductor die which leaves an upper portion of each of the plurality of stud bumps exposed. In some specific embodiments the plurality of stud bumps are copper stud bumps.

These and other embodiments of the present invention, as well its advantages and features, are described in more detail in conjunction with the description below and attached figures.

BRIEF DESCRIPTION OF THE DRAWINGS

FIGS. 7A-7C are diagrams showing the selection of angles used to form bumps of varying heights according to embodiments of the present invention;

DETAILED DESCRIPTION OF THE INVENTION

The present invention relates to generally to wafer level packaging technology. More specifically, embodiments of the invention pertain to the use of wire bonding techniques used to form stud bumps for wafer-level packages.

Figure 1:
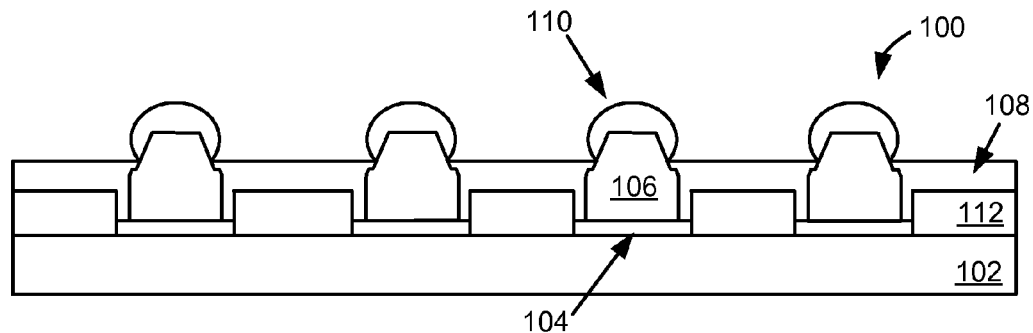
FIG. 1 is a simplified cross-sectional drawing of a wafer-level package incorporating stud bumps according to one embodiment of the invention.

FIG. 1 is a simplified cross-sectional drawing of a wafer-level package 100 according to an embodiment of the present invention. Package 100 includes a semiconductor die 102 having one or more active devices (not shown) formed thereon using conventional semiconductor manufacturing processes during front-end processing. The active devices include bond pads 104 which may be made from aluminum or other suitable materials and a passivation layer 112. Passivation layer electrically isolates bond pads 104 from each other to prevent short-circuiting of the active devices and may be, for example, a nitride layer or other suitable material. Bond pads 104 can be designed and fabricated in a peripheral format, array format or any other suitable arrangement.

Wafer-level package 100 further includes stud bumps 106 coated with solder 110 as interconnects for the package. Stud bumps 106 are formed using wire bonding techniques as described in detail below directly over bond pads 104 without an intermediate under-bump metallization layer used in conventional wafer level packages. In one embodiment, stud bumps 106 are made from copper wire but other embodiments of the invention can use wire made from other suitable materials to form the stud bumps.

A mold encapsulation layer 108 surrounds the outside surface of stud bumps 106 providing stability and environmental protection to wafer-level package 100. Mold encapsulation layer 108 may be formed from plastic or epoxy and does not cover the entirety of stud bumps 106. The protrusion of stud bumps 106 from mold encapsulation layer 108 allows electrical connection between the active devices within semiconductor die 102 and an exterior portion of the package.

Figure 2:
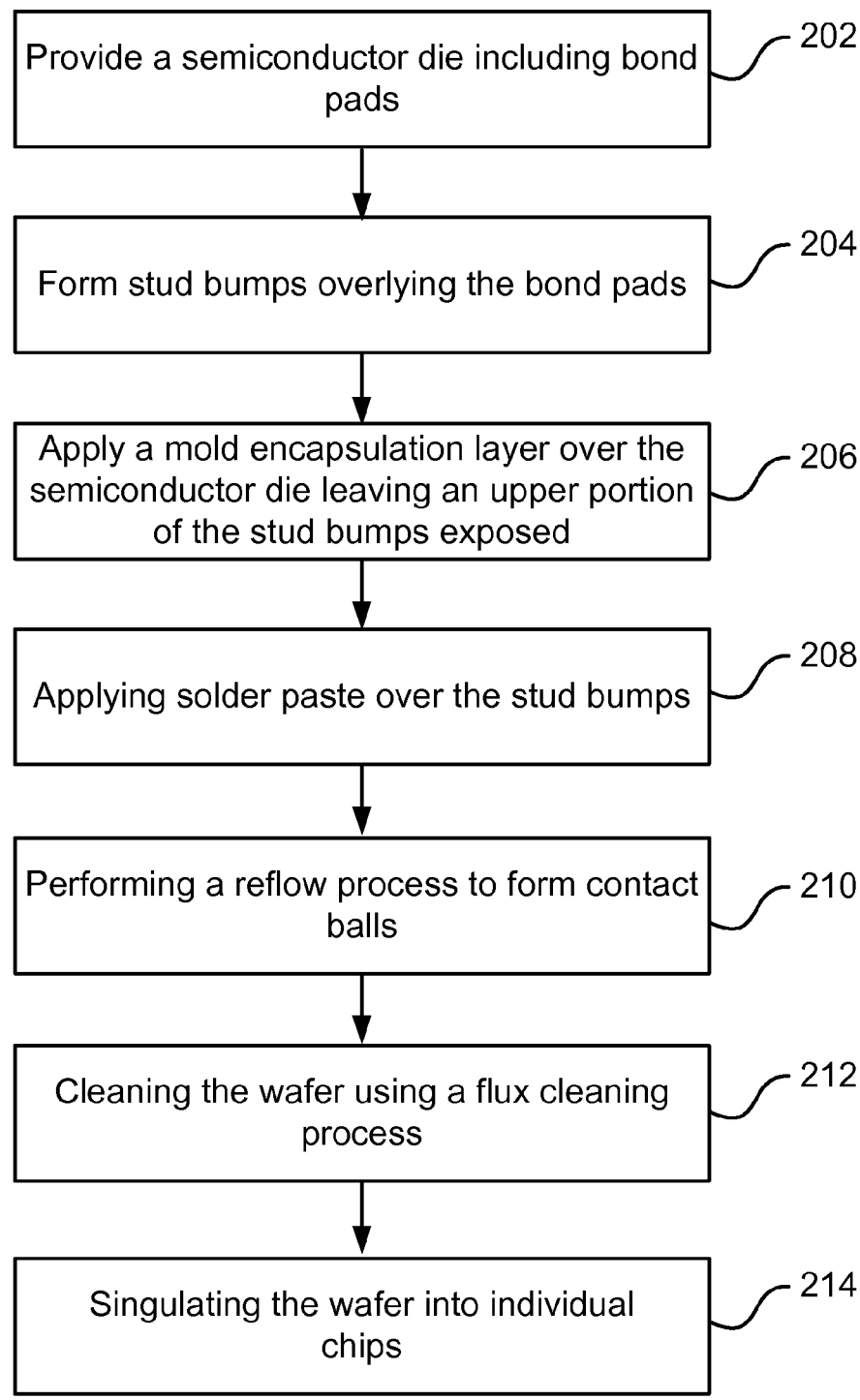
FIG. 2 is a flowchart illustrating steps employed in the formation and singulation of a wafer-level package according to an embodiment of the present invention.

FIG. 2 is a flow chart illustrating steps used in the formation and singulation of a wafer-level package according to an embodiment of the present invention. To better understand the invention, FIG. 2 may be viewed in conjunction with FIG. 3, a simplified process flow showing the formation and singulation of a wafer-level package according to an embodiment of the present invention.

Figure 3:
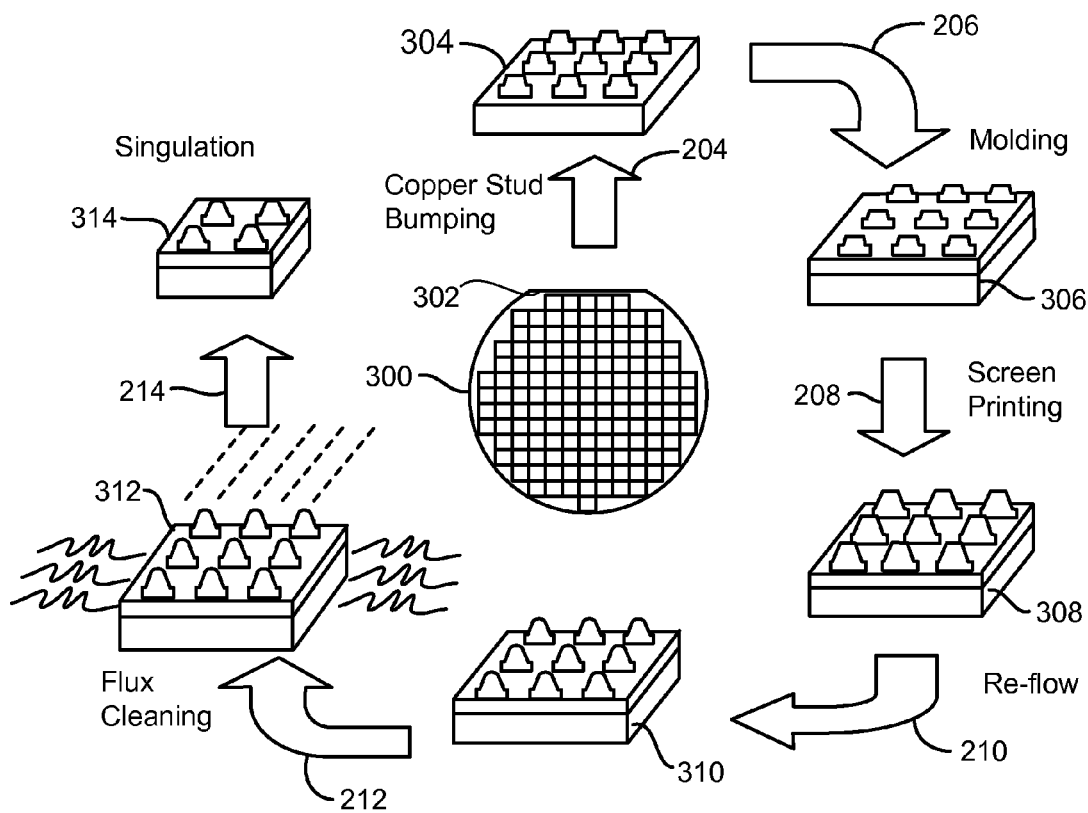
FIG. 3 is a simplified process flow showing the formation and singulation of a wafer-level package according to the steps recited in the flowchart of FIG. 2.

Referring to FIGS. 2 and 3, a wafer 300 is provided (Step 202). Wafer 300 includes a semiconductor die 302 having active devices formed thereon and bond pads overlying the semiconductor die. Stud bumps are then formed overlying the bond pads (Step 204). The result of this process is shown as partially completed package in 304. A molding encapsulation process is then performed (Step 206) that leaves an upper portion of the stud bumps exposed in a partially completed package in 306.

In a specific embodiment of the present invention, the molding encapsulates ½-¾ of the total bump height of the stud bumps. In another embodiment, the molding layer completely encapsulates the stud bumps when initially deposited but is then opened to expose the stud bumps using a laser, back grinding or other technique. The protrusion of stud bumps 106 (FIG. 1) from mold encapsulation layer 108 provides for leads between the active devices within semiconductor die 102 and an exterior portion of the package. In addition, the use of mold encapsulation layer 108 obviates the need for an underfill layer, thus reducing the number of processes needed to fully package the devices for shipment. In another embodiment of the present invention, over molding can be used to completely encapsulate package 100, with an etching, laser etching, or grinding process then used to expose the stud bumps.

A screen printing or solder dipping process is then used to deposit a layer of solder paste on top of the stud bumps (Step 208) forming partially completed package 308, and a reflow process (Step 210) is used to form the solder into ball interconnects better suited for electrical interconnection as shown in partially completed package in 310. In one embodiment, tin may be used as the solder material but other appropriate solders may be used as well.

The wafer is then cleaned using a flux cleaning process as known to those of skill in the art to remove oxidation from the solder overlying the stud bumps (Step 212). In addition to removal of potential oxidation from the solder, the flux cleaning process also serves to improve wetting characteristics of the solder for improved bonds between the balls and a printed circuit board or other device. The result of this process is shown as partially completed package 312.

The wafer is then singulated into individual packaged IC integrated circuits 314 (Step 214), which can be packaged onto tape and reel or waffle packs for shipment as a finished product to customers. Each wafer-level package 314 formed after singulation includes one or more active devices. In some embodiments wafer-level test and burn-in of the chips is performed prior to singulation. This offers cost-savings as compared to individually performing similar processes upon each chip package after singulation.

Figure 4A:
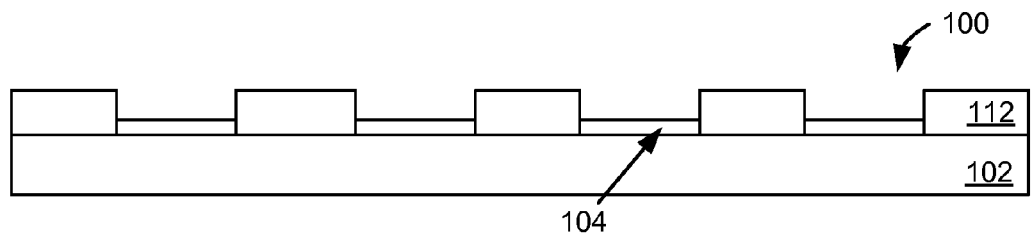
FIGS. 4A-4D are simplified cross-sectional drawings of a wafer level package at various stages of formation as set forth in FIGS. 2 and 3.
Figure 4B:
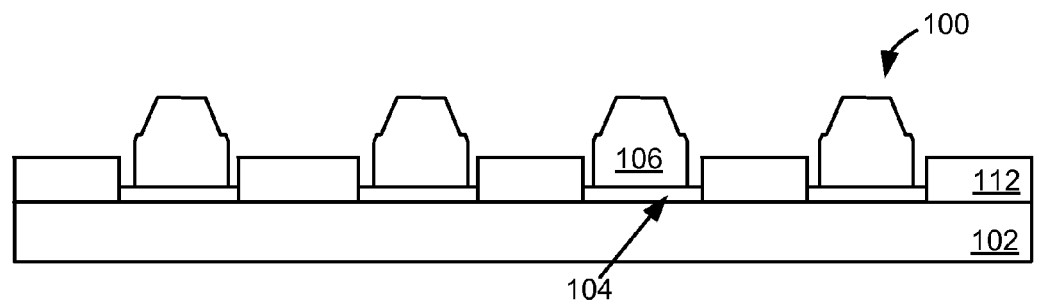
Figure 4C:
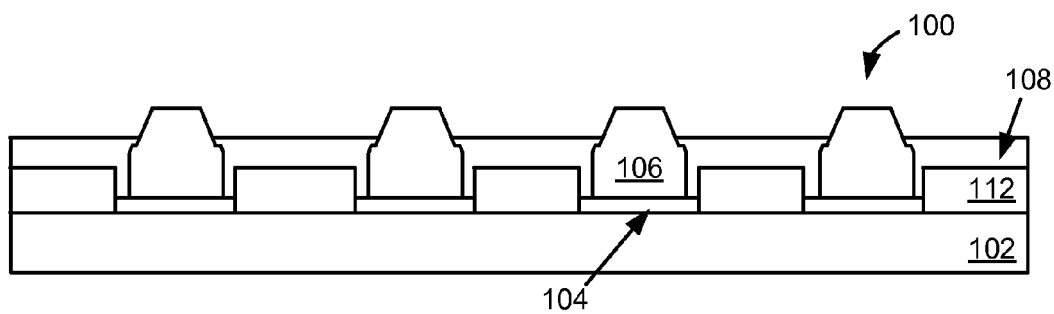
Figure 4D:
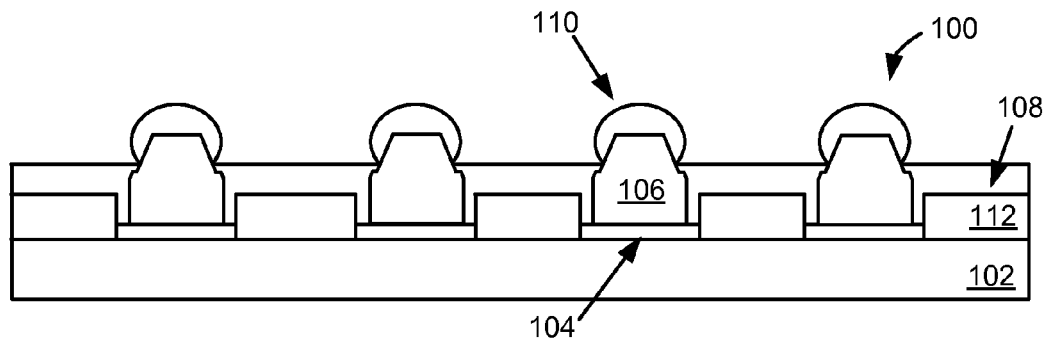

FIGS. 4A-4D represent simplified cross-sectional views of a wafer-level package 100 at the various steps of formation described in FIGS. 2 and 3. Specifically, FIG. 4A shows package 100 at step 202 of FIG. 2; FIG. 4B shows package 100 at step 204; FIG. 4C shows the package at step 206 and FIG. 4D shows the package at step 208.

A wafer-level package formed according to the steps set forth in FIG. 2 can be formed at a lower cost than conventional implementations. The use of wire-bonding to form the stud bump obviates the need to use an under-bump metallization layer, while still maintaining a reliable interconnection between the stud bump and the underlying bond pad. This, in turn, reduces the need for masking, etching, or plating processes that are normally used to form the under-bump metallization layer. In addition, the completed wafer package 100 has sufficient structural strength that it meets the standard board-level reliability metrics for wafer-level packaging without employing an underfill layer for board mounting in some embodiments of the invention.

Figure 5:
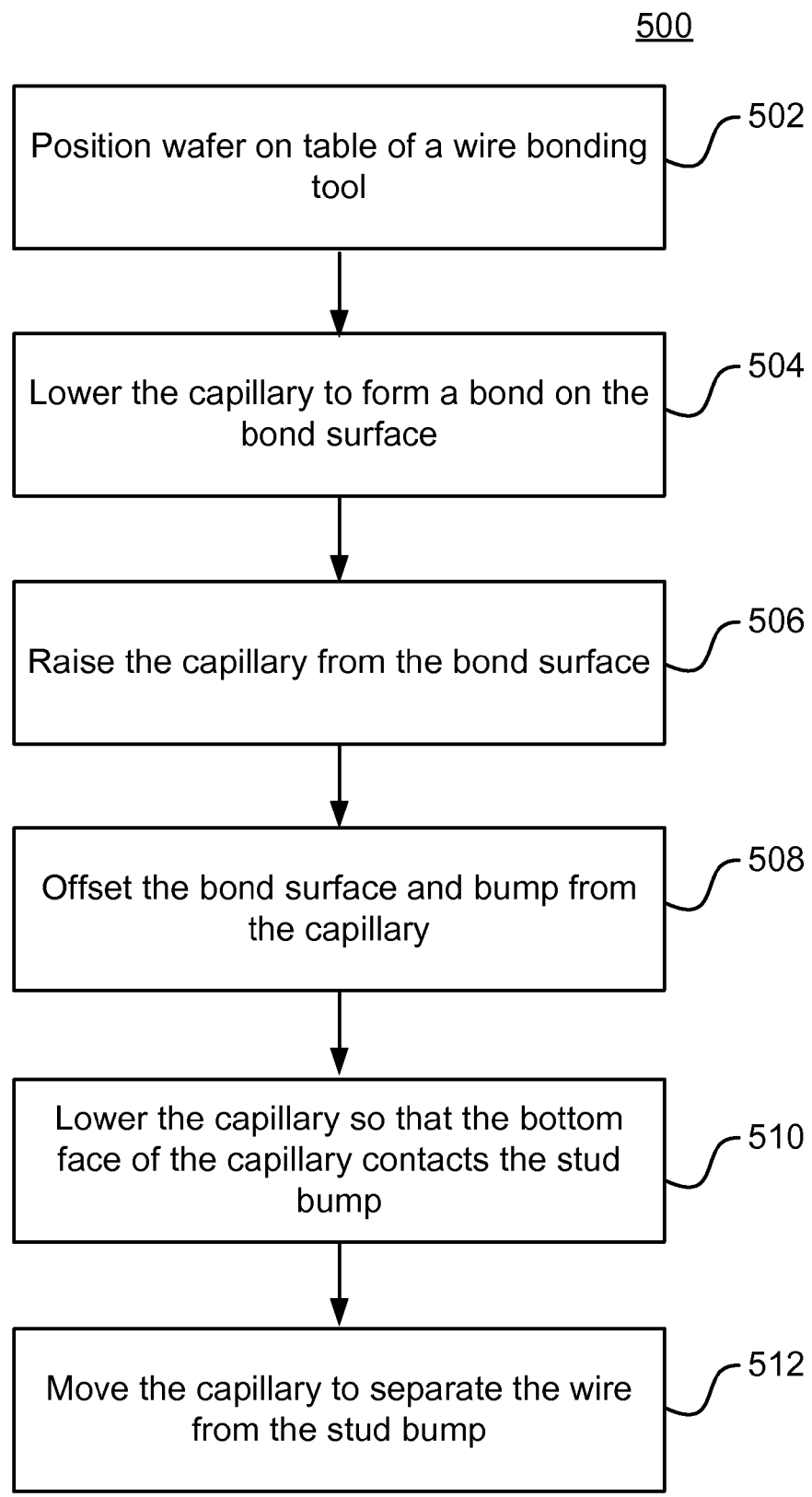
FIG. 5 is a flowchart illustrating steps employed in a stud bumping process according to one embodiment of the invention.

FIG. 5 is a flowchart illustrating the steps used to form stud bumps 106 according to one embodiment of the invention. FIG. 5 may be viewed in conjunction with FIGS. 6A-6E, which are simplified cross-sectional drawings of a wire bonding tool at various stages of the stud bump formation process according to an embodiment of the invention.

As shown in FIG. 5, a semiconductor wafer, such as wafer 300 shown in FIG. 3, is positioned on a table associated with an appropriate wire bonding tool (step 502). Wafer 300 has formed thereon a plurality of integrated circuits, each of which includes a plurality of bonding pads (represented in FIGS. 6A-6E as bonding surfaces 612). The wire bonding tool includes a capillary 602 with a bottom face 606 that is positioned above bonding surface 612 during the wire bonding operation. Wire bonding tool also includes a feed hole (not labeled) for receiving a wire 608 and a chamfer 604 surrounding the feed hole at the bottom face 606.

Capillary 602 contains a wire 608 that can be gradually extruded from feed hole 614 in capillary 602. For example, wire 608 may be housed within a threaded capillary used for precise control over the amount of wire 608 extended from capillary 602. An electric flame-off tool (not shown) may be used to form the end of wire 608 into a free air ball (not shown) for optimal deposition. The free air ball can then be captured by the capillary 602 within the chamfer area 604 and then lowered to the bond surface 612 to form stud bump 610.

Figure 6A:
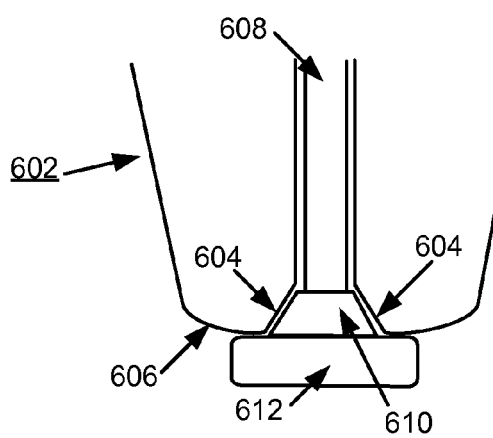
FIGS. 6A-6E are simplified cross-sectional drawings of the formation of a wafer-level package incorporating stud bumps according to an embodiment of the present invention.

During the bond formation process capillary 602 is lowered so that the extruded portion of wire 608 is contacts and forms a bond on bond surface 612 (step 504). A number of different wire bonding techniques may be utilized to form and bond stud bump 610 to bond surface 612 including compression bonding, thermo-compression bonding, thermosonic bonding and ultrasonic bonding. Through the application of mechanical force, heat, and/or ultrasonic energy, a bond is formed between stud bump 610 and bond surface 612. Bond surface 612 may be for example, a bond pad overlying a semiconductor die, which includes one or more active devices. The initial formation of stud bump 610 at this stage is shown in FIG. 6A.

Figure 6B:
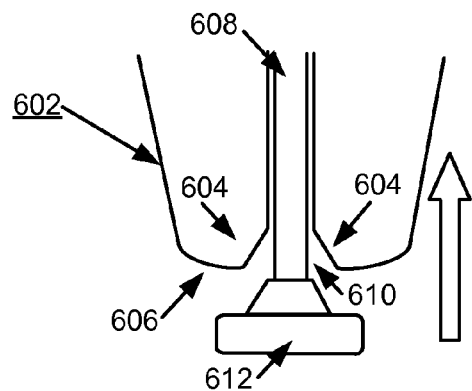
Figure 6C:
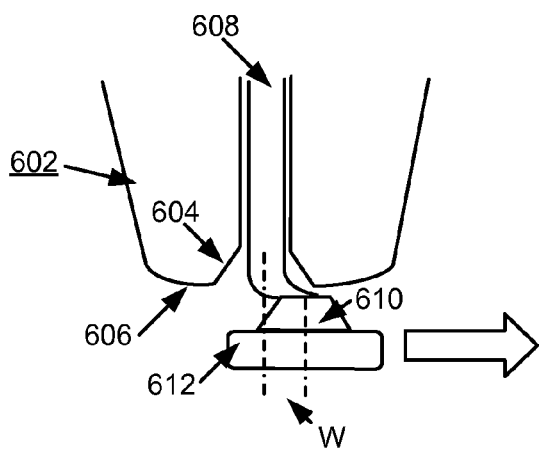

Capillary 602 is then raised from bond surface 612 while allowing stud bump 610 to stay in contact with bond surface 612 without breaking wire 608 (step 506). Thus, stud bump 610 is still coupled with wire 608 during process 506. The result of this process is shown in FIG. 6B. Next, bond surface 612 and stud bump 610 are offset from capillary 602 by an width W (step 508) while the wire is still attached to the top of the stud bump. The offset may be accomplished by displacing a table removably coupled with the semiconductor die thus translating bond surface 612 and stud bump 610 in a lateral direction. Alternatively, capillary 602 may also be moved while keeping bond surface 612 and stud bump 610 stationary. The effect of the lateral offset is that capillary 602 is shifted a width W from the bond surface 612 and stud bump 610. In some embodiments, width W is in the range of 1.0-2.0 times the diameter of the wire size. The result of this process is shown in FIG. 6C.

Figure 6D:
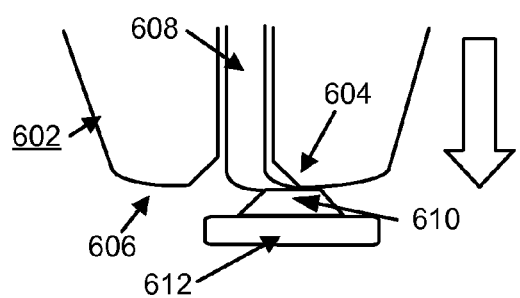

Capillary 602 is then lowered downward so that the bottom face 606 of capillary 602 contacts stud bump 610 pressing the pulled portion of the wire (still connected to the top of the stud bump) downwards onto the top surface of the stud bump (step 510). This step flattens the top of stud bump 610 and forms what is referred to herein as a second bond. The flattened surface on stud bump 610 allows for easier deposition and adhesion of the solder paste onto the stud bump as a result of the increased amount of sidewall surface as compared to a more vertical surface. The result of this process is shown in FIG. 6D.

Figure 6E:
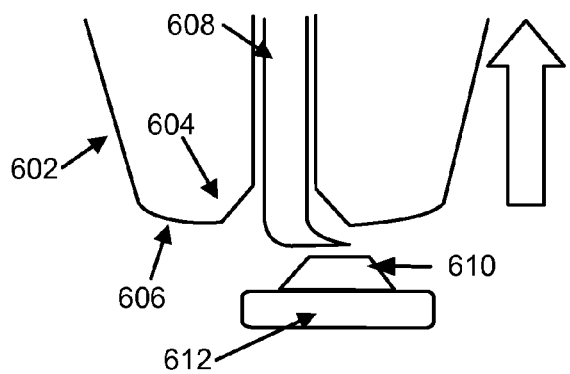

Next, capillary 602 is moved upwards to separate wire 608 from stud bump 610 (step 512). The upwards movement of the entire capillary serves to break wire 608 away from stud bump 610, which remains bonded to bond surface 612. Because of the strong bond created by the previous steps, the pulling up and breaking of the wire does not affect the flattened profile of the top of stud bump 610. The result of this process is shown in FIG. 6E. By utilizing this process, a clean break between wire 608 and bond surface 612 can be obtained so that the process flow 500 can be repeated to form additional stud bumps on the remaining bond pads. Examples of the height and width of typical stud bumps formed using the processes described in FIGS. 6A-6E is set forth in Table 1 below.

TABLE 1

| Wire Size | Bump Type | Bump Height | Bump Size |
| --- | --- | --- | --- |
| 1.0 mil | Single bump | 50 ± 10 μm | 85 ± 10 μm |
| 1.0 mil | Two stack bump | 90 ± 10 μm | 90 ± 10 μm |
| 1.0 mil | Three stack bump | 125 ± 10 μm | 95 ± 10 μm |
| 2.0 mil | Single bump | 101 ± 10 μm | 140 ± 10 μm |
| 4.0 mil | Single bump | 150 ± 10 μm | 317 ± 20 μm |

Figure 7C:
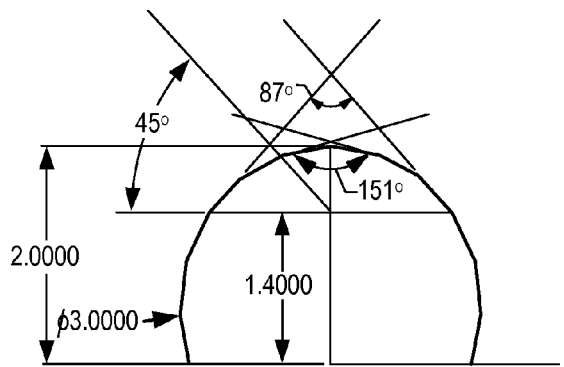
Figure 7C:
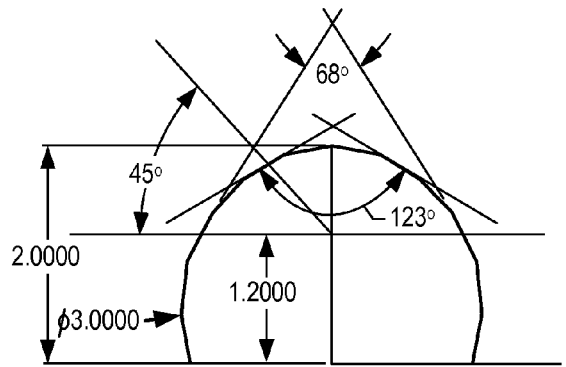
Figure 7C:
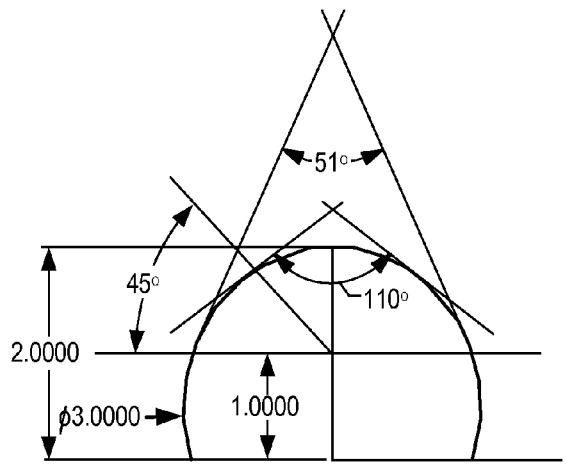

FIGS. 7A-7C are diagrams showing different capillary designs that can be used to form bumps of varying heights according to an embodiments of the present invention. For example, the angles and dimensions described shown in FIG. 7A may be used by one of skill in the art to design a capillary where ball height is 70% of the eventually desired overall bump height. Similarly, FIGS. 7B and 7C show angles and dimensions that may be used to design capillaries with different internal chamfer angles to form a desired bump size. The use of different angle selection parameters allows for increased flexibility as all that is needed to change the wire-bonding device is a change in the bumping parameters used in the capillary.

Figure 8:
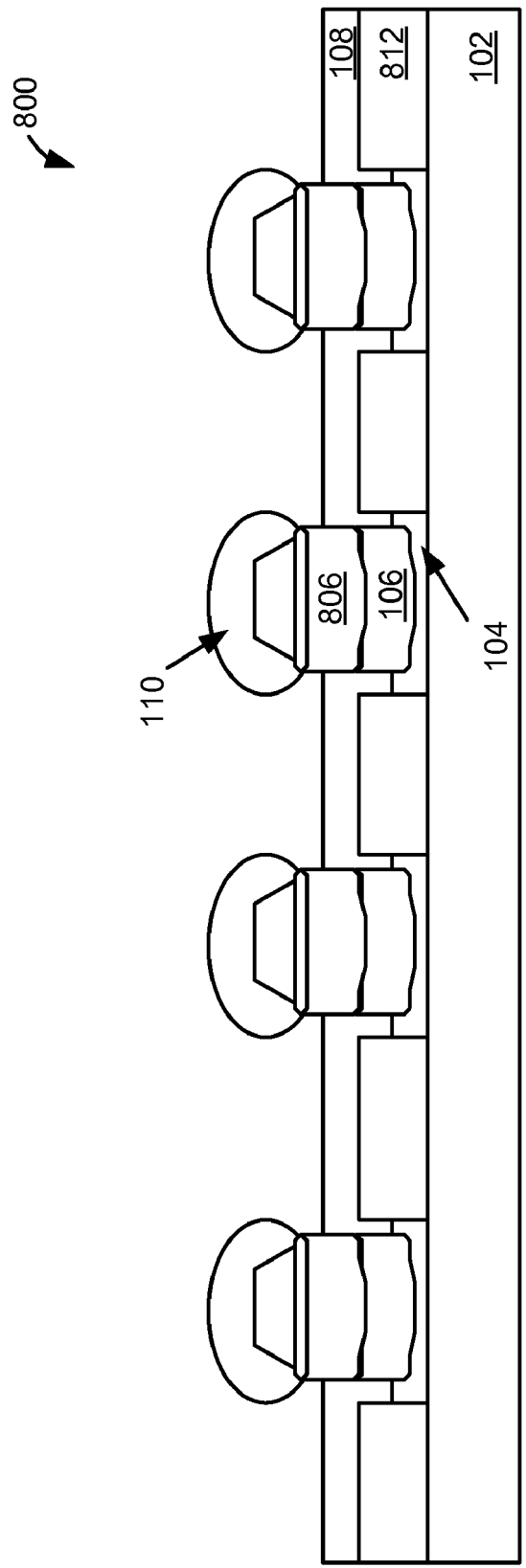
FIG. 8 is a simplified cross-sectional drawing of a wafer-level package incorporating stacked stud bumps according to another embodiment of the invention.

In some embodiments of the invention, stacked stud bumps can be formed to increase the height of the stud bump for particular packages. An example of such a package is illustrated in FIG. 8, which is a simplified cross-sectional drawing of a wafer-level package incorporating a stacked stud bump design according to an embodiment of the present invention. Wafer-level package 800 shown in FIG. 8 may be used if an increased height of the stud bumps is required to couple wafer-level package 800 with a printed circuit device or other device. FIG. 8 shares many similar elements with FIG. 1, such as semiconductor die 102, bond pads 104, passivation layer 112, encapsulation layer 108, and solder 110. The primary difference between package 100 and package 800 is that package 800 includes stacked stud bumps formed by stacking stud bumps 814 directly on top of stud bumps 106. Stud bump 814 is essentially formed by repeating the stud bump formation process described in FIGS. 5 and 6A-6E a second time. Stud bump 806 is formed directly overlying first stud bump 106 and provides additional height to the package 800 for improved interconnections. Thus, stacked stud bumps comprising two, three, or more stud bumps are possible, depending upon the specific bump height requirements of the package. For example, a typical height of the stacked stud bump 106, 806 is between 3-6 mm, about twice the height of the stud bumps formed in package 100. The use of a stacked bump design allows for an increased bump height without increasing the bump diameter, as often required by area-array packages. Typically, the same material (e.g., copper) is used to form the all of the multiple stud bumps in a stacked stud bump configuration.

An alternate method of increasing the bump height is to use wire of a greater diameter, as the eventual bump height following formation is correlated with the diameter of the wire used. By using thicker wire and appropriate parameters, the bump height obtained may be comparable to that obtained using a stacked bump process. For example, copper wire with a diameter between 1-4 mm can be used to form the stud bumps.

The description above has been given to help illustrate the principles of this invention. It is not intended to limit the scope of this invention in any way. A large variety of variants are apparent, which are encompassed within the scope of this invention.

While the stud bumps 104 have been described as being formed using a copper process, other suitable wire materials that can be used for ball bonding can be used instead of copper to form the stud bumps. As an example, the stud bumps can be made out of gold or aluminum wires in other embodiments. Also, while the invention has been described in detail and with reference to specific examples thereof, it will be apparent to one skilled in the art that various changes and modifications can be made therein without departing from the spirit and scope thereof.

What is claimed is:

1. A method of fabricating a wafer-level package comprising:
   fabricating at least one active device on a semiconductor wafer that has not been singulated, the active device having a plurality of bonding pads exposed at an upper surface of the wafer; and
   prior to singulating the semiconductor wafer: (i) forming a plurality of corresponding metal stud bumps on the plurality of bonding pads using a wire bonding technique, and thereafter (ii) applying a molding encapsulation layer over the semiconductor wafer leaving an upper portion of each of the plurality of stud bumps exposed.

2. The method of fabricating a wafer-level package set forth in claim 1 further comprising singulating the semiconductor wafer to separate the active device from the wafer after the molding encapsulation layer is applied over the semiconductor wafer.

3. A method of fabricating a wafer-level package comprising:
   fabricating at least one active device on a semiconductor wafer that has not been singulated, the active device having a plurality of bonding pads exposed at an upper surface of the wafer; and
   prior to singulating the semiconductor wafer: (i) forming a plurality of corresponding stud bumps on the plurality of bonding pads, and thereafter (ii) applying a molding encapsulation layer over the semiconductor wafer leaving an upper portion of each of the plurality of stud bumps exposed;
   wherein the plurality of stud bumps formed on the plurality of bonding pads are copper stud bumps formed with a wire bonding tool from copper wire.

4. A method of fabricating a wafer-level package comprising:
   fabricating at least one active device on a semiconductor wafer that has not been singulated, the active device having a plurality of bonding pads exposed at an upper surface of the wafer; and
   prior to singulating the semiconductor wafer: (i) forming a plurality of corresponding stud bumps on the plurality of bonding pads, and thereafter (ii) applying a molding encapsulation layer over the semiconductor wafer leaving an upper portion of each of the plurality of stud bumps exposed;
   wherein the plurality of stud bumps formed on the plurality of bonding pads are gold or aluminum stud bumps formed with a wire bonding tool from gold or aluminum wire.

5. A method of fabricating a wafer-level package comprising:
   fabricating at least one active device on a semiconductor wafer that has not been singulated, the active device having a plurality of bonding pads exposed at an upper surface of the wafer; and
   prior to singulating the semiconductor wafer: (i) forming a plurality of corresponding stud bumps on the plurality of bonding pads, and thereafter (ii) applying a molding encapsulation layer over the semiconductor wafer leaving an upper portion of each of the plurality of stud bumps exposed;
   wherein the plurality of corresponding stud bumps formed on the plurality of bonding pads are stacked stud bumps formed by forming at least a second set of bumps directly overlying a first set of bumps, wherein each of the first and second sets of bumps are formed with a wire bonding tool.

6. The method of fabricating a wafer-level package set forth in claim 1 wherein the molding encapsulation layer encapsulates between 50-75% of the bump height of the stud bumps.

7. The method of fabricating a wafer-level package set forth in claim 1 wherein the molding encapsulation layer completely encapsulates the stud bumps when initially applied and the stud bumps are exposed with a laser, back grounding or other process.

8. The method of fabricating a wafer-level package set forth in claim 1 further comprising coating each of the plurality of stud bumps with solder.

9. The method of fabricating a wafer-level package set forth in claim 1 further comprising:
   coating each of the plurality of stud bumps with solder;
   reflowing the solder;
   using a flux cleaning process to clean the stud bumps; and
   thereafter, singulating the semiconductor wafer to form a plurality of wafer-level packages.

10. The method of fabricating a wafer-level package set forth in claim 1 wherein the plurality of bonding pads are in peripheral format or array format.

11. The method of fabricating a wafer-level package set forth in claim 1 wherein a wire bonding tool used to form the plurality of stud bumps includes a capillary having a feed hole for dispensing a wire, a bottom face, and a chamfer surrounding the feed hole at the bottom face, and wherein each of the plurality of stud bumps formed on the bonding pads is formed by:
   lowering the capillary towards the semiconductor wafer to allow an extruded portion of the wire from the feed hole to contact and form a first bond with a corresponding bond pad without breaking the wire;
   raising the capillary away from the semiconductor wafer while allowing the extruded portion of the wire to stay in contact with the bond pad without breaking the wire;
   offsetting the capillary from the first bond in a direction parallel to the upper surface of the semiconductor wafer;
   lowering the capillary so that the bottom face of the capillary contacts the stud bump and flattens a top surface of the stud bump; and
   moving the capillary away from the semiconductor die to separate the wire from the stud bump.

12. A method of fabricating a plurality of wafer-level packages comprising:
   fabricating a plurality of active devices on a semiconductor wafer that has not been singulated, wherein each of the active devices has a plurality of bonding pads exposed at an upper surface of the wafer; and
   prior to singulating the semiconductor wafer to separate the plurality of active devices: (i) for each of the plurality of active devices, forming a plurality of copper stud bumps corresponding to the plurality of bonding pads associated with the active device using a wire bonding tool, (ii) applying a molding encapsulation layer over the semiconductor wafer leaving an upper portion of each of the plurality of stud bumps formed on each of the active devices exposed, (iii) applying solder paste over each of the exposed of copper stud bumps, (iv) reflowing the solder paste, and (v) cleaning the substrate with flux.

13. The method of fabricating a plurality of wafer-level packages set forth in claim 12 further comprising singulating the semiconductor wafer to separate the plurality of active devices and form the plurality of wafer-level packages.

14. The method of fabricating a plurality of wafer-level packages set forth in claim 13 wherein each wafer-level package comprises a single active device.

15. The method of fabricating a plurality of wafer-level packages set forth in claim 12 wherein the plurality of stud bumps are stacked stud bumps, where each stacked stud bump is formed by forming a plurality of stud bumps directly overlying each other, wherein each of the plurality of stud bumps in a stack of stud bumps is formed with a wire bonding tool.

16. The method of fabricating a wafer-level package set forth in claim 12 wherein the plurality of stud bumps formed on the plurality of bonding pads are copper stud bumps.

17. The method of fabricating a wafer-level package set forth in claim 12 wherein the plurality of stud bumps formed on the plurality of bonding pads are gold or aluminum stud bumps.

18. The method of fabricating a wafer-level package set forth in claim 12 wherein the molding encapsulation layer encapsulates between 50-75% of the bump height of the stud bumps.

* * * * *